(12) United States Patent
Suh et al.

(10) Patent No.: US 7,381,984 B2
(45) Date of Patent: Jun. 3, 2008

(54) THIN FILM TRANSISTOR AND FLAT PANEL DISPLAY INCLUDING THE SAME

(75) Inventors: Min-Chul Suh, Suwon-si (KR); Jae-Bon Koo, Suwon-si (KR); Sang-Min Lee, Suwon-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 235 days.

(21) Appl. No.: 11/280,761

(22) Filed: Nov. 15, 2005

(65) Prior Publication Data
US 2006/0124924 A1 Jun. 15, 2006

(30) Foreign Application Priority Data
Nov. 19, 2004 (KR) .................... 10-2004-0094908

(51) Int. Cl.
*H01L 21/336* (2006.01)
*H01L 51/30* (2006.01)

(52) U.S. Cl. .................... 257/40; 257/79; 257/102

(58) Field of Classification Search ........... 257/40, 257/79, 102, E51.019, E51.026, E33.06, 257/E33.063
See application file for complete search history.

(56) References Cited

U.S. PATENT DOCUMENTS
7,208,756 B2 * 4/2007 Shih et al. .................... 257/40

2003/0013220 A1 * 1/2003 Lupo et al. .................... 438/29

FOREIGN PATENT DOCUMENTS
KR 1020020022614 A 3/2002
KR 1020030057966 A 7/2003

* cited by examiner

*Primary Examiner*—George Fourson
(74) *Attorney, Agent, or Firm*—Knobbe Martens Olson & Bear LLP

(57) ABSTRACT

Provided are a thin film transistor and an organic electroluminescent display including the same. The organic electroluminescent display includes: a gate electrode; source and drain electrodes that are insulated from the gate electrode; an organic semiconductor layer that is insulated from the gate electrode and electrically connected to the source and drain electrodes; an insulating layer that insulates the gate electrode from the source and drain electrodes or the organic semiconductor layer; and an electron withdrawing layer composed of a Lewis acid compound formed between the source and drain electrodes and the organic semiconductor layer. Charges can easily accumulate so that a channel doping effect occurs in the semiconductor layer, thus preventing the formation of an energy barrier and increasing the number of carriers that are injected into a channel. As a result, a TFT having a low contact resistance, an large number of injected carriers, and good charge mobility can be obtained. A flat panel display including the TFT is reliable and has low power consumption.

4 Claims, 2 Drawing Sheets

THIN FILM TRANSISTOR AND FLAT PANEL DISPLAY INCLUDING THE SAME

CROSS-REFERENCE TO RELATED PATENT APPLICATIONS

This application claims the benefit of Korean Patent Application No. 10-2004-0094908, filed on Nov. 19, 2004, in the Korean Intellectual Property Office, the disclosure of which is incorporated herein in its entirety by reference.

BACKGROUND OF THE INVENTION

1. Field of the Invention

The present invention relates to a thin film transistor and a flat panel display including the same, and more particularly, to an organic electroluminescent display with a low contact resistance between source and drain electrodes and a semiconductor layer.

2. Description of the Related Art

Thin film transistors (TFTs) which are used in flat panel display, such as liquid crystalline display, organic electroluminescent display, inorganic electroluminescent display, and the like, act as switching devices that control the operation of each pixel, and as driving sources that operate the pixels.

A TFT includes a semiconductor layer that has source and drain regions doped with a highly concentrated impurity and a channel region formed therebetween, a gate electrode that is insulated from the semiconductor layer and disposed above the channel region, and source and drain electrodes that contact the source and drain regions, respectively.

Generally, the source and drain electrodes are formed of a low work function metal so that electric charges can move smoothly therein. However, when the low work function metal contacts the semiconductor layer, a high contact resistance results, and thus the characteristics of the device deteriorate and the power consumption is increased.

Recently, TFTs have become thin and flexible. In order to obtain such flexibility, conventional glass substrates have been replaced by plastic substrates.

Organic TFTs, which are being actively studied, include organic semiconductor layers that can be formed at low temperatures so that plastic substrates can be used. In this case, however, the contact resistance of a contact region between the source and drain electrodes and the semiconductor layer is high.

SUMMARY OF THE INVENTION

The present invention provides a thin film transistor with low contact resistance between a semiconductor layer and source and drain electrodes, and a flat panel display including the same.

According to an aspect of the present invention, there is provided a thin film transistor including: a gate electrode; source and drain electrodes that are insulated from the gate electrode; an organic semiconductor layer that is insulated from the gate electrode and electrically connected to the source and drain electrodes; and an insulating layer that insulates the gate electrode from the source and drain electrodes or the organic semiconductor layer; and an electron withdrawing layer comprising a Lewis acid compound arranged between the organic semiconductor layer and at least one of source and drain electrodes.

According to another aspect of the present invention, there is provided a flat panel display including a plurality of pixels. Each of the pixels includes the thin film transistor. The source electrode or drain electrode of the thin film transistor is connected to a pixel electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described in detail.

When a metal used to form source and drain electrodes contacts a semiconductor used to form a semiconductor layer, a potential barrier is generated as a result of the different characteristics of the metal and the semiconductor, that is, the difference between the work function of the metal and the electron affinity of the semiconductor. When the potential barrier is large, the flow of electrons is impeded.

In order to solve this problem, according to embodiments of the present invention, an electron withdrawing layer composed of a Lewis acid compound is formed between the source and drain electrodes of a thin film transistor (TFT) and the semiconductor layer. When the semiconductor layer is formed of a p-type semiconductor having many electrons, charges can easily accumulate, even in a low electric field, because of the electron withdrawing layer formed of the Lewis acid compound, which is an electron pair acceptor, between the p-type semiconductor layer and the source and drain electrodes. Such easy charge accumulation brings about channel doping effects on the semiconductor layer, thus decreasing the strength of the energy barrier and increasing the number of carriers entering the channel. As a result, the contact resistance can be decreased, and the carrier injection and the charge mobility can be increased.

The thickness of the electron withdrawing layer must be sufficiently small for the carrier injection to be facilitated without an increase of the conductivity of the semiconductor layer that is an active layer. The thickens of the electron withdrawing layer may be 100 Å or less, for example, in the range of 5 Å to 100 Å.

The Lewis acid compound that forms the electron withdrawing layer may be $AsF_5$, $SO_3$, $FeCl_3$, $SbCl_5$, $SbF_5$, $BF_3$, $BCl_3$, $BBr_3$, $PF_5$, or the like. In addition, any material that can accept electron pairs can act as the Lewis acid compound.

A method of forming the electron withdrawing layer is not limited. For example, the electron withdrawing layer can be formed by depositing the Lewis acid compound.

Embodiment of the present invention will now be described in detail with reference to the appended drawings.

Figure 1:
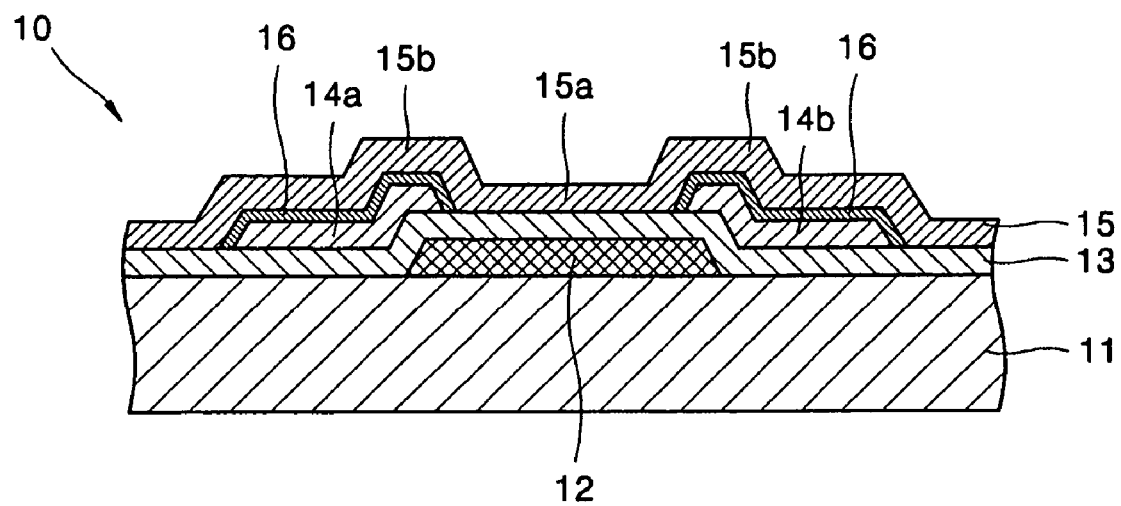
FIG. 1 is a sectional view of a thin film transistor according to an embodiment of the present invention.

FIG. 1 is a sectional view of a TFT 10 according to an embodiment of the present invention.

Referring to FIG. 1, a substrate 11 may be composed of glass or plastics. A gate electrode 12 with a predetermined pattern is formed on the substrate 11, and an insulating layer 13 covers the gate electrode 12. Source and drain electrodes 14a and 14b are formed on the insulating layer 13. Portions of the source and drain electrodes 14a and 14b may overlap the gate electrode 12, as shown in FIG. 1. However, the location of the source and drain electrodes 14a and 14b are not limited thereto.

The source and drain electrodes 14a and 14b may be composed of a noble metal with a work function of 5.0 eV or greater, which is selected depending on the material for an organic semiconductor layer. The noble metal with a work function of 5.0 eV or greater may be Au, Pd, Pt, Ni, Rh, Ru, Ir, Os, alloys of these, and the like, preferably, Au, Pd, Pt, Ni, and the like. However, the noble metal with a work function of 5.0 eV or greater is not limited thereto.

The source and drain electrodes 14a and 14b can be composed of a metal that can be oxidized, or a metal oxide considering a bonding force between the source and drain electrodes 14a and 14b and an electron withdrawing layer to be formed thereon. The metal that can be oxidized may be Au, Pd, Pt, Ni, Ru, Os, Al, Mo, a composite of these, or the like, but is not limited thereto. The metal oxide may be $Au_2O_3$, PdO, $PtO_2$, NiO, $Ni_2O_3$, $RuO_4$, $OsO_4$, ITO, IZO, a composite of these, or the like, but is not limited thereto.

An organic semiconductor layer 15 entirely covers the source and drain electrodes 14a and 14b. The organic semiconductor layer 15 includes source and drain regions 15b and a channel region 15a connecting the source and drain regions 15b.

The organic semiconductor layer 15 is composed of an organic semiconductor material, such as pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiophene-heterocycle aromatic copolymer and derivatives thereof, oligoacene of naphthalene and derivatives thereof, oligothiophene of α-5-thiophene and derivatives thereof, metal phthalocyanine, metal-free phthalocyanine and derivatives thereof, pyromelitic acid dianhydride and derivatives thereof, pyromelitic acid diimide and derivatives thereof, and the like.

An electron withdrawing layer 16 may be formed between the source and drain electrodes 14a and 14b and the organic semiconductor layer 15.

Figure 2:
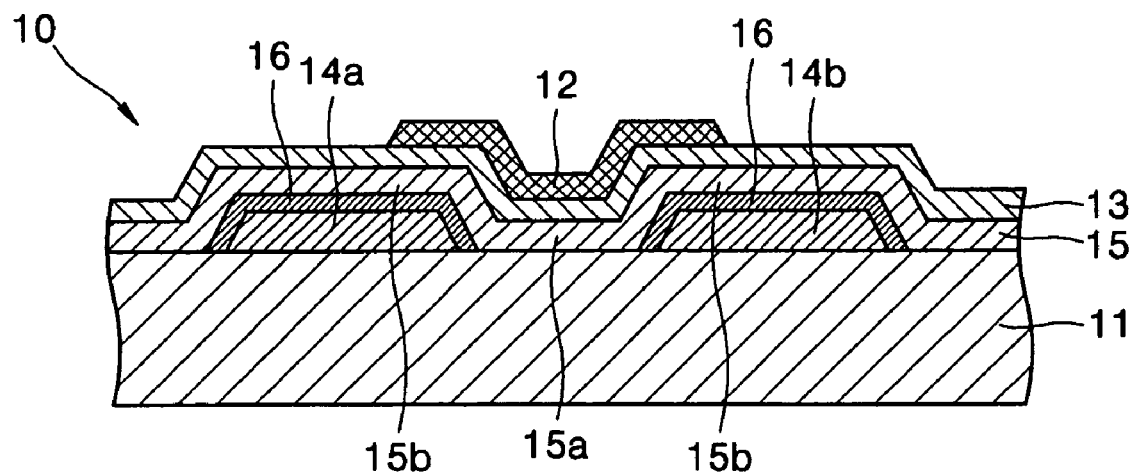
FIG. 2 is a sectional view of a thin film transistor according to another embodiment of the present invention.

The TFT according to embodiments of the present invention may have various stacked structures. For example, refereeing to FIG. 2, the source and drain electrodes 14a and 14b, the electron withdrawing layer 16, the organic semiconductor layer 15, the insulating layer 13, and the gate electrode 12 may be stacked sequentially.

The TFT can be formed by forming an insulating layer on an insulating substrate having a gate electrode thereon, forming source and drain electrodes on predetermined portions of the insulating layer corresponding to ends of the gate electrode, covering the source and drain electrodes with an electron withdrawing layer, and then covering the electron withdrawing layer with an organic semiconductor layer. The method of manufacturing the TFT may vary according to the structure of the TFT.

As described above, the TFT with the above-mentioned structure can be used in flat display, such as liquid crystalline display (LCD) and organic electrolyteminescent display.

Figure 3:
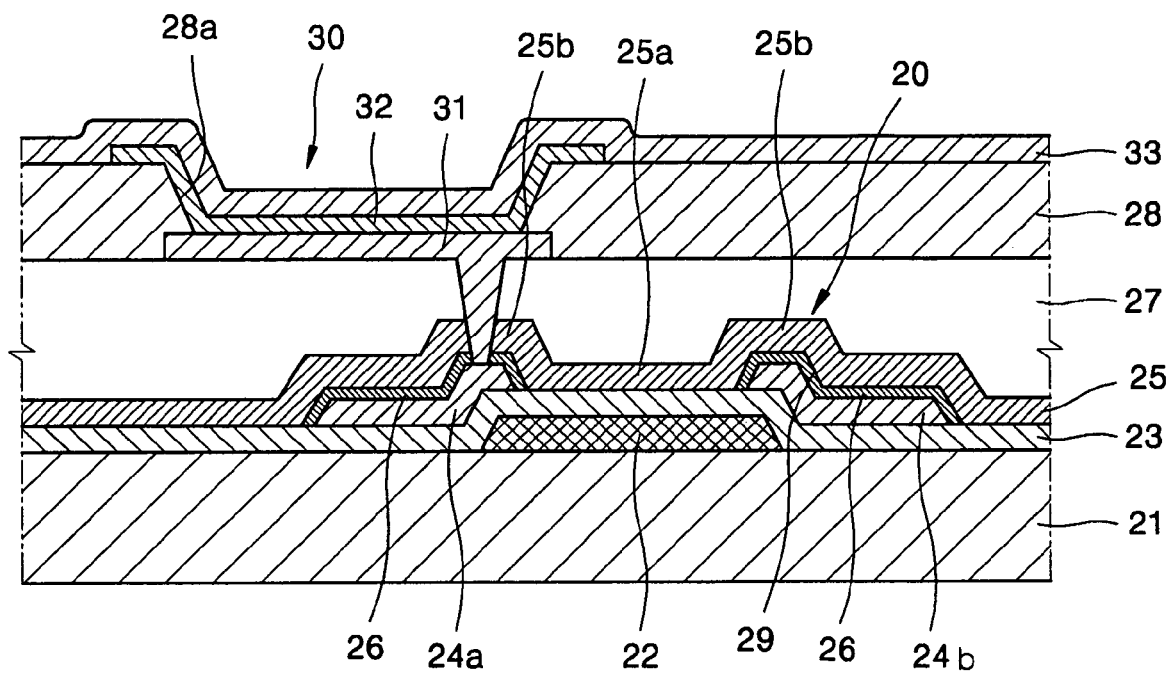
FIG. 3 is a sectional view of an organic electroluminescent display including the thin film transistor shown in FIG. 1.

FIG. 3 is a sectional view of an organic electroluminescent display including the TFT shown in FIG. 1.

In detail, FIG. 3 is a sectional view of a sub pixel of the organic electroluminescent display. The sub pixel includes an organic electroluminescent (EL) device, which is a self-emission device, and at least one TFT.

The organic electroluminescent display has pixels producing various colors, preferably, red, green, and blue pixels, according to the emission color of the EL device.

Referring to FIG. 3, a gate electrode 22 with a predetermined pattern is formed on a substrate 21. An insulating layer 23 covers the gate electrode 22. Source and drain electrodes 24a and 24b are formed on the insulating layer 23. An electron withdrawing layer 26 is formed on the source and drain electrodes 24a and 24b. A compound for forming the electron withdrawing layer 26 is the same as in the previous embodiment.

An organic semiconductor layer 25 covers the electron withdrawing layer 26, thereby completing a TFT 20. The organic semiconductor layer 25 includes source and drain regions, and a channel region connecting the source and drain regions.

A passivation layer 27 covers the TFT 20. The passivation layer 27 may be formed of a single layer or many layers composed of an organic material, an inorganic material, or an organic/inorganic composite material.

An organic emission layer 32 of an EL device 30 is formed along the surface of a pixel defining layer 28 on the passivation layer 27.

The EL device 30, which produces light corresponding to predetermined image information by emitting red light, green light, or blue light according to the flow of the current, includes a pixel electrode 31 connected to one of the source and drain electrodes 24a and 24b of the TFT 20, an opposite electrode 33 covering the entrie pixels, and the organic emission layer 32, which emits light and is interposed between the pixel electrode 31 and the opposite electrode 33. However, the structure of the EL device 30 is not limited thereto.

The organic emission layer 32 may be a low molecular weight organic layer or a polymer organic layer. When the organic emission layer 32 is the low molecular weight organic layer, the organic emission layer 32 may be a single or composite layer including a hole injection layer (HIL), a hole transport layer (HTL), an emission layer (EML), an electron transport layer (ETL), an electron injection layer (EIL), and the like. A low molecular weight organic material that forms the low molecular weight organic layer may be copper phthalocyanine (CuPc), (N,N'-Di(naphthalene-1-yl)-N,N'-diphenyl-benzidine: NPB), tris-8-hydroxyquinoline aluminum(Alq3), or the like. The low molecular weight organic layer may be formed using vacuum deposition.

When the organic emission layer 32 is a polymer organic layer, the organic emission layer 32 may include an HTL composed of PEDOT and an EML composed of a polyphenylenevinylene (PPV) compound or a polyfluorene compound. The polymer organic layer may be formed by screen printing, inkjet printing, or the like.

The organic emission layer 32 is not limited to the above description.

The pixel electrode 31 may act as an anode electrode and the opposite electrode 33 may act as a cathode electrode. Alternatively, the pixel electrode 31 may act as the cathode electrode and the opposite electrode 33 may act as the anode electrode.

In a liquid crystalline display (LCD) device, a lower opposite layer (not shown) that covers the pixel electrode 31 may be further formed to completely manufacture a lower substrate of the LCD device.

The TFT according to the present invention can be included in sub pixels, as illustrated in FIG. 3, and in a driver circuit (not shown) not used to form an image.

In addition, in the organic EL display a flexible plastic substrate is used for the substrate 21.

As described above, the formation of an electron withdrawing layer composed of a Lewis acid compound, which is an electron pair acceptor, between a semiconductor layer and source and drain electrodes results in easy charge accumulation, even in a low electric field. As a result, a channel doping effect occurs on the semiconductor layer, and thus the strength of an energy barrier decreases, and the number of carriers injected into a channel is increased. Therefore, a TFT having a low contact resistance, a large number of injected carriers, and good charge mobility can be obtained. A flat panel display including the TFT has good reliability and low power consumption.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film transistor comprising:
   a gate electrode;
   source and drain electrodes that are insulated from the gate electrode;
   an organic semiconductor layer that is insulated from the gate electrode and electrically connected to the source and drain electrodes; and
   an insulating layer that insulates the gate electrode from the source and drain electrodes or the organic semiconductor layer; and
   an electron withdrawing layer comprising a Lewis acid compound arranged between the organic semiconductor layer and at least one of source and drain electrodes, wherein the Lewis acid compound is at least one compound selected from the group consisting of $AsF_5$, $SO_3$, $SbCl_5$, $SbF5$, $BF_3$, $BCl_3$, $BBr_3$, and $PF_5$.

2. The thin film transistor of claim 1, wherein the source and drain electrodes are composed of at least one compound selected from the group consisting of Au, Pd, Pt, Ni, Rh, Ru, Ir, Os, Al, Mo, $Au_2O_3$, PdO, $PtO_2$, NiO, $Ni_2O_3$, $RuO_4$, $OsO_4$, ITO, and IZO.

3. The thin film transistor of claim 1, wherein the organic semiconductor layer is composed of at least one compound selected from the group consisting of pentacene, tetracene, anthracene, naphthalene, α-6-thiophene, α-4-thiophene, perylene and derivatives thereof, rubrene and derivatives thereof, coronene and derivatives thereof, perylene tetracarboxylic diimide and derivatives thereof, perylene tetracarboxylic dianhydride and derivatives thereof, polythiophene and derivatives thereof, polyparaphenylenevinylene and derivatives thereof, polyparaphenylene and derivatives thereof, polyfluorene and derivatives thereof, polythiophenevinylene and derivatives thereof, polythiopheneheterocycle aromatic copolymer and derivatives thereof, oligoacene of naphthalene and derivatives thereof, oligothiophene of α-5-thiophene and derivatives thereof, metal phthalocyanine, metal-free phthalocyanine and derivatives thereof, pyromelitic acid dianhydride and derivatives thereof, and pyromelitic acid diimide and derivatives thereof.

4. A flat panel display comprising a plurality of pixels, each of the pixels comprising the thin film transistor,
   wherein the thin film transistor comprising a gate electrode; source and drain electrodes that are insulated from the gate electrode; an organic semiconductor layer that is insulated from the gate electrode and electrically connected to the source and drain electrodes; and an insulating layer that insulates the gate electrode from the source and drain electrodes or the organic semiconductor layer; and an electron withdrawing layer comprising a Lewis acid compound arranged between the organic semiconductor layer and at least one of source and drain electrodes,
   wherein the source electrode or drain electrode of the thin film transistor is connected to a pixel electrode; and
   wherein the Lewis acid compound contains at least one compound selected from the group consisting of $AsF_5$, $SO_3$, $SbCl_5$, $SbF_5$, $BF_3$, $BCl_3$, $BBr_3$, and $PF_5$.

* * * * *